United States Patent
Hsiao et al.

(10) Patent No.: US 11,152,954 B2
(45) Date of Patent: Oct. 19, 2021

(54) DECODING METHOD AND STORAGE CONTROLLER

(71) Applicant: Shenzhen EpoStar Electronics Limited CO., Shenzhen (CN)

(72) Inventors: Yu-Hua Hsiao, Hsinchu County (TW); Ting-Ya Yang, Taichung (TW); Yuan-Syun Wu, Taoyuan (TW)

(73) Assignee: Shenzhen EpoStar Electronics Limited CO., Shenzhen (CN)

( * ) Notice: Subject to any disclaimer, the term of this patent is extended or adjusted under 35 U.S.C. 154(b) by 187 days.

(21) Appl. No.: 16/016,684

(22) Filed: Jun. 25, 2018

(65) Prior Publication Data

US 2019/0312593 A1     Oct. 10, 2019

(30) Foreign Application Priority Data

Apr. 10, 2018  (TW) ................................ 107112335

(51) Int. Cl.
  *H03M 13/11*     (2006.01)
  *G06F 11/10*     (2006.01)
  *H03M 13/00*     (2006.01)
  *G11C 29/52*     (2006.01)

(52) U.S. Cl.
  CPC ..... *H03M 13/1108* (2013.01); *G06F 11/1068* (2013.01); *G11C 29/52* (2013.01); *H03M 13/1128* (2013.01); *H03M 13/616* (2013.01)

(58) Field of Classification Search
  CPC ......... H03M 13/1108; H03M 13/1128; H03M 13/616; G11C 29/52; G11C 2029/0409; G11C 2029/0411; G06F 11/1068
  See application file for complete search history.

(56) References Cited

U.S. PATENT DOCUMENTS

| | | | |
|---|---|---|---|
| 2018/0191377 A1* | 7/2018 | Wang | H03M 13/1108 |
| 2019/0158115 A1* | 5/2019 | Kuo | H03M 13/1108 |
| 2019/0163567 A1* | 5/2019 | Lin | H03M 13/3715 |

* cited by examiner

*Primary Examiner* — Cynthia Britt
*Assistant Examiner* — Rong Tang
(74) *Attorney, Agent, or Firm* — JCIPRNET

(57) ABSTRACT

A decoding method is provided, and the method includes performing a decoding operation on a plurality of data bit value sets of a codeword. The decoding operation includes following steps: (1) obtaining a syndrome of the data bit value sets; (2) determining whether the codeword is correct or incorrect according to the latest obtained syndrome, wherein if the codeword is correct, the decoding operation is ended, wherein if the codeword is wrong, continuing to step (3) to start an iterative operation; (3) obtaining a plurality of error value sets respectively corresponding to the data bit value sets, wherein in response to obtaining a first error value set, steps (4) and (5) are performed simultaneously; (4) performing an extreme value search operation; (5) performing a bit-flipping operation; and (6) performing a syndrome calculation operation after the step (5) is completed, and performing step (2).

16 Claims, 5 Drawing Sheets

DECODING METHOD AND STORAGE CONTROLLER

CROSS-REFERENCE TO RELATED APPLICATION

This application claims the priority benefit of Taiwan application serial no. 107112335, filed on Apr. 10, 2018. The entirety of the above-mentioned patent application is hereby incorporated by reference herein and made a part of this specification.

BACKGROUND

Technical Field

The invention relates to a decoding technique, and more particularly, to a decoding method and a storage controller using a bit-flipping algorithm of a low density parity code.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., a flash memory) ideal to be built in the portable multi-media devices as cited above.

Generally, in order to ensure correctness of data stored by the rewritable non-volatile memory module, before data is stored into the rewritable non-volatile memory module, such data would be encoded first. The encoded data (including original and error correcting codes) may be stored into the rewritable non-volatile memory module. Later, the encoded data may be read from the rewritable non-volatile memory module and decoded to correct possible errors in the data. Conventionally, error correcting codes often adopt algebraic decoding algorithms, such as BCH code. At present, a probabilistic decoding algorithm such as a low density parity code (LDPC), have gradually matured. The LDPC code is often used in a decoding operation together through a parity check matrix.

FIG. 4 illustrates a schematic timing diagram of a decoding operation according to a traditional approach. With reference to FIG. 4, it is assumed that the decoding operation is currently performed on a codeword, and a plurality of data bit values of the codeword may be grouped into a plurality of data bit value sets $G_1$ to $G_N$. Each decoding operation may include an initial syndrome calculation operation together with one or more subsequent iterative operations.

More specifically, in the initial syndrome operation, syndrome operations (e.g., syndrome operations $S[G_1]$ to $S[G_N]$ started from a calculation cycle "1") are sequentially performed (according to an order of the data bit value sets $G_1$ to $G_N$) on each of the data bit value sets to obtain corresponding temporary syndromes. Eventually, a final syndrome may be obtained, and whether the decoding is successful may be determined according to the final syndrome. Here, the syndrome calculation operation performed on each data bit value set takes one calculation cycle. For example, for N syndrome calculation operations performed on N data bit value sets $G_1$ to $G_N$, it is required to take a total of N calculation cycles to complete all the syndrome calculation operations. N is a total number of the data bit value sets.

If the decoding is successful (i.e., the codeword is determined as correct), the entire decoding operation is ended; if the decoding is failed (i.e., the codeword is determined as incorrect), a first iterative operation is performed. Taking the first iterative operation as an example, first of all, error function calculation operations (e.g., error function calculation operations $E[G_1]$ to $E[G_N]$ started from a calculation cycle "N+1") are sequentially performed on the data bit value sets $G_1$ to $G_N$. Here, the error function calculation operation performed on each data bit value set takes one calculation cycle.

After the error function calculation is completed for a first data bit value set, extreme value search operations (e.g., extreme value search operations $M[G_1]$ to $M[G_N]$ started from a calculation cycle "N+2") are then performed on the data bit value sets $G_1$ to $G_N$. Here, the extreme value search operation performed on each data bit value set takes one calculation cycle.

Next, after all the extreme value search operations $M[G_1]$ to $M[G_N]$ are completed, bit-flipping operations (e.g., the bit-flipping operations $F[G_1]$ to $F[G_N]$ started from a calculation cycle "2N+2") are sequentially performed on each of the data bit value sets $G_1$ to $G_N$. Here, the bit-flipping operation performed on each data bit value set takes one calculation cycle.

Finally, after the bit-flipping operation performed on the first data bit value set is completed, syndrome calculation operations (e.g., syndrome calculation operations $S[G_1]$ to $S[G_N]$ started from a calculation cycle "2N+3") are sequentially performed on the flipped data bit value set to obtain corresponding temporary syndromes. Eventually, a final syndrome may be obtained, and whether the decoding is successful in this iterative operation may be determined according to the final syndrome.

However, in each of the iterative operations using the traditional approach, sometimes it is necessary to wait for the previous operation to complete before the next operation can be started. Therefore, an overall time of the iterative operations may be overly long. Accordingly, how to shorten the overall time of the iterative operations to reduce an entire duration of the decoding operation and thus improve performance of the LDPC decoder is a topic of concern to persons skilled in the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention provides a decoding method adapted to a low density parity code decoder, which is capable of shortening the entire duration of the decoding operation to improve performance in the low density parity code decoding operation.

An embodiment of the invention provides a decoding method suitable for a low density parity code decoder. The method includes: receiving a codeword, grouping a plurality of data bits of the codeword into a plurality of data bit value sets, and performing a decoding operation on the data bit value sets. The decoding operation includes following steps: (1) sequentially performing a plurality of syndrome calculation operations respectively on the data bit value sets by using a plurality of parity check sub-matrices of a parity check matrix, so as to obtain a plurality of temporary syndromes respectively corresponding to the data bit value sets, and performing a step (2) after all the temporary syndromes respectively corresponding to the data bit value sets are obtained; (2) determining whether the codeword is correct or incorrect according to the latest obtained temporary syndromes, wherein if the codeword is determined as correct, the decoding operation is completed and the data bits are outputted, wherein if the codeword is determined as incorrect, a step (3) is performed to start one new iterative operation; (3) sequentially performing a plurality of error function calculations according to the temporary syndromes, so as to sequentially obtain a plurality of error value sets respectively corresponding to the data bit value sets, wherein in response to obtaining a first error value set, steps (4) and (5) are performed simultaneously; (4) sequentially performing a plurality of extreme value search operations on the error value sets to identify a target extreme value from all error values in the error value sets, and setting an error threshold for a next iterative operation according to the target extreme value; (5) sequentially performing a plurality of bit-flipping operations respectively on the data bit value sets according to an error threshold for a current iterative operation and the error value sets so as to update the data bit value sets, wherein if the current iterative operation is a first iterative operation, the error threshold for the current iterative operation is a predetermined error threshold, wherein if the current iterative operation is not the first iterative operation, the error threshold for the current iterative operation is an error threshold identified in a previous iterative operation, wherein in response to completing a first bit-flipping operation, a step (6) is performed simultaneously; (6) sequentially performing a plurality of syndrome calculation operations respectively on the updated data bit value sets by using the parity check sub-matrices, so as to obtain a plurality of temporary syndromes respectively corresponding to the updated data bit value sets, wherein in response to obtaining all the temporary syndromes respectively corresponding to the updated data bit value sets, the current iterative operation is completed and the step (2) is performed, wherein each of said iterative operations includes the steps (2) to (6), wherein the updated data bit value sets, the corresponding temporary syndromes and the error threshold obtained from the current iterative operation are used in the next iterative operation.

An embodiment of the invention provides a storage controller for controlling a storage device having a rewritable non-volatile memory module. The storage controller includes a memory interface control circuit, an error checking and correcting circuit and a processor. The memory interface control circuit is configured to couple to the rewritable non-volatile memory module. The processor is coupled to the error checking and correcting circuit and the memory interface control circuit, wherein the memory interface control circuit transmits a codeword read from the rewritable non-volatile memory module to the error checking and correcting circuit. The error checking and correcting circuit is configured to receive the codeword, group a plurality of data bits of the codeword into a plurality of data bit value sets, and perform a decoding operation on the data bit value sets. In the performed decoding operation, the error checking and correcting circuit is configured to perform following operations: (1) the error checking and correcting circuit is configured to sequentially perform a plurality of syndrome calculation operations respectively on the data bit value sets by using a plurality of parity check sub-matrices of a parity check matrix, so as to obtain a plurality of temporary syndromes respectively corresponding to the data bit value sets, and perform a step (2) after all the temporary syndromes respectively corresponding to the data bit value sets are obtained; (2) the error checking and correcting circuit is configured to determine whether the codeword is correct or incorrect according to the latest obtained temporary syndromes, wherein if the codeword is determined as correct, the decoding operation is completed and the data bits are outputted, wherein if the codeword is determined as incorrect, a step (3) is performed to start one new iterative operation; (3) the error checking and correcting circuit is configured to sequentially perform a plurality of error function calculations according to the temporary syndromes, so as to sequentially obtain a plurality of error value sets respectively corresponding to the data bit value sets, wherein in response to obtaining a first error value set, steps (4) and (5) are performed simultaneously; (4) the error checking and correcting circuit is configured to sequentially perform a plurality of extreme value search operations on the error value sets to identify a target extreme value from all error values in the error value sets, and set an error threshold for a next iterative operation according to the target extreme value; (5) the error checking and correcting circuit is configured to sequentially perform a plurality of bit-flipping operations respectively on the data bit value sets according to an error threshold for a current iterative operation and the error value sets so as to update the data bit value sets, wherein if the current iterative operation is a first iterative operation, the error threshold for the current iterative operation is a predetermined error threshold, wherein if the current iterative operation is not the first iterative operation, the error threshold for the current iterative operation is an error threshold identified in a previous iterative operation, wherein in response to completing a first bit-flipping operation, a step (6) is performed simultaneously; (6) the error checking and correcting circuit is configured to sequentially perform a plurality of syndrome calculation operations respectively on the updated data bit value sets by using the parity check sub-matrices, so as to obtain a plurality of temporary syndromes respectively corresponding to the updated data bit value sets, wherein in response to obtaining all the temporary syndromes respectively corresponding to the updated data bit value sets, the error checking and correcting circuit is configured to complete the current iterative operation and perform the step (2), wherein each of said iterative operations includes the steps (2) to (6), wherein the updated data bit value sets, the corresponding temporary syndromes and the error threshold obtained from the current iterative operation are used in the next iterative operation.

Based on the above, the decoding method and the storage controller provided by the embodiments of the invention can perform all the bit-flipping operations while still performing the extreme value search operations instead of waiting for all the extreme value search operations to complete. As a result, the overall time taken each time when the iterative operation is performed may be shortened to improve decoding efficiency and enhance work efficiency.

To make the above features and advantages of the invention more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated

DESCRIPTION OF THE EMBODIMENTS

Figure 1:
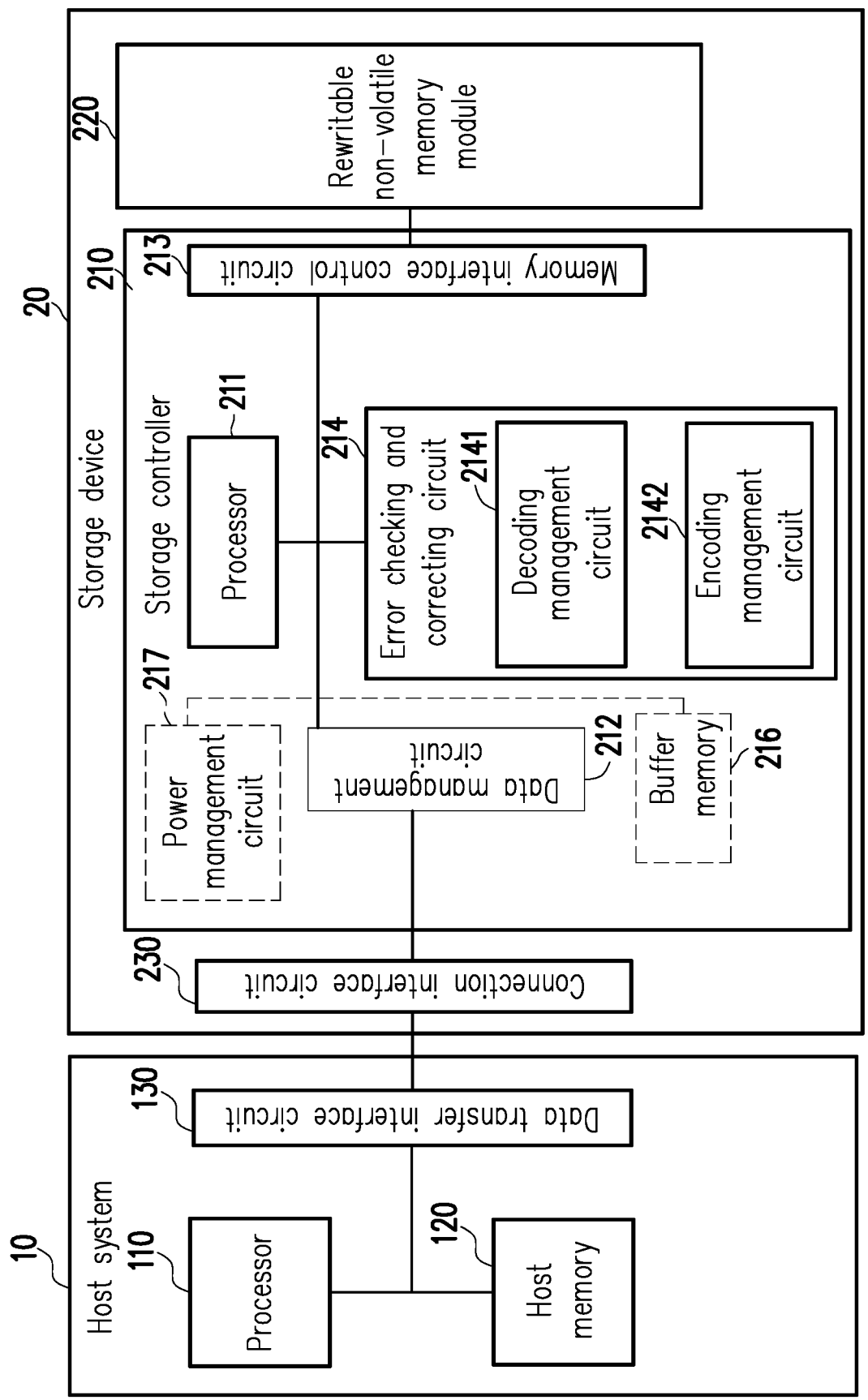
FIG. 1 is a block diagram illustrating a host system and a storage device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In this embodiment, a storage device includes a rewritable non-volatile memory module and a storage device controller (also referred to as a storage controller or a storage control circuit). Also, the storage device is usually used together with a host system so the host system can write data into or read data from the storage device.

FIG. 1 is a block diagram illustrating a host system and a storage device according to an embodiment of the invention.

Referring to FIG. 1, a host system 10 includes a processor 110, a host memory 120 and a data transfer interface circuit 130. In this embodiment, the data transfer interface circuit 130 is coupled (or, electrically connected) to the processor 110 and the host memory 120. In another embodiment, the processor 110, the host memory 120 and the data transfer interface circuit 130 are coupled to one another by utilizing a system bus.

A storage device 20 includes a storage controller 210, a rewritable non-volatile memory module 220 and a connection interface circuit 230. Among them, the storage controller 210 includes a processor 211, a data management circuit 212 and a memory interface control circuit 213.

In this embodiment, the host system 10 is coupled to the storage device 20 through the data transfer interface circuit 130 and the connection interface circuit 230 of the storage device 20 to perform a data access operation. For example, the host system 10 can store data to the storage device 20 or read data from the storage device 20 through the data transfer interface circuit 130.

In this embodiment, the processor 110, the host memory 120 and the data transfer interface circuit 130 may be disposed on a main board of the host system 10. The number of the data transfer interface circuit 130 may be one or more. Through the data transfer interface circuit 130, the main board may be coupled to the storage device 20 in a wired manner or a wireless manner. The storage device 20 may be, for example, a flash drive, a memory card, a solid state drive (SSD) or a wireless memory storage device. The wireless memory storage device may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board may also be coupled to various I/O devices including a GPS (Global Positioning System) module, a network interface card, a wireless transmission device, a keyboard, a monitor and a speaker through the system bus.

In this embodiment, the data transfer interface circuit 130 and the connection interface circuit 230 are an interface circuit compatible with a Peripheral Component Interconnect Express (PCI Express) interface standard. Further, a data transfer is performed between the data transfer interface circuit 130 and the connection interface circuit 230 by using a communication protocol of a Non-Volatile Memory express (NVMe) interface standard.

Nevertheless, it should be understood that the invention is not limited to the above. The data transfer interface circuit 130 and the connection interface circuit 230 may also be compatible to a PATA (Parallel Advanced Technology Attachment) standard, an IEEE (Institute of Electrical and Electronic Engineers) 1394 standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC interface standard, a UFS (Universal Flash Storage) interface standard, an eMCP interface standard, a CF interface standard, an IDE (Integrated Device Electronics) interface standard or other suitable standards. Further, in another embodiment, the connection interface circuit 230 and the storage controller 210 may be packaged into one chip, or the connection interface circuit 230 is distributed outside a chip containing the storage controller 210.

In this embodiment, the host memory 120 is configured to temporarily store commands executed by the processor 110 or data. For instance, in this exemplary embodiment, the host memory 120 may be a DRAM (Dynamic Random Access Memory), or a SRAM (Static Random Access Memory) and the like. Nevertheless, it should be understood that the invention is not limited thereto, and the host memory 120 may also be other appropriate memories.

The storage unit 210 is configured to execute a plurality of logic gates or control commands, which are implemented in a hardware form or in a firmware form, and to perform operations of writing, reading or erasing data in the rewritable non-volatile memory storage module 220 according to the commands of the host system 10.

More specifically, the processor 211 in the storage controller 210 is a hardware with computing capabilities, which is configured to control overall operation of the storage controller 210. Specifically, the processor 211 has a plurality of control commands and the control commands are executed to perform various operations such as writing, reading and erasing data during operation of the storage device 20.

It is noted that, in this embodiment, the processor 110 and the processor 211 are, for example, a central processing unit (CPU), a micro-processor, other programmable microprocessors, a digital signal processor (DSP), a programmable controller, an application specific integrated circuits (ASIC), a programmable logic device (PLD) or other similar circuit elements, which are not particularly limited by the invention.

In an embodiment, the storage controller 210 further includes a ROM (not illustrated) and a RAM (not illustrated). More particularly, the ROM has a boot code, which is executed by the processor 221 to load the control commands stored in the rewritable non-volatile memory module 220 into the RAM of the storage controller 210 when the storage controller 210 is enabled. Then, the control commands are executed by the processor 211 to perform operations, such as writing, reading or erasing data. In another embodiment, the control commands of the processor 211 may also be stored as program codes in a specific area (for example, physical storage units in the rewritable non-volatile memory module 220 dedicated for storing system data) of the rewritable non-volatile memory module 220.

In this embodiment, as described above, the storage controller 210 further includes the data management circuit 212 and the memory interface control circuit 213. It should be noted that, operations performed by each part of the storage controller 220 may also be considered as operations performed by the storage controller 220.

The data management circuit 212 is coupled to the processor 211, the memory interface control circuit 213 and the connection interface circuit 230. The data management circuit 212 is configured to transmit data under instruction of the processor 211. For example, the data may be read from the host system 10 (e.g., the host memory 120) through the connection interface circuit 230, and the read data may be written into the rewritable non-volatile memory module 220 through the memory interface control circuit 213 (e.g., a writing operation performed according to a write command from the host system 10). As another example, the data may be read from one or more physical units of the rewritable non-volatile memory module 220 through the memory interface control circuit 213 (the data may be read from one or more memory cells in one or more physical units), and the read data may be written into the host system 10 (e.g., the host memory 120) through the connection interface circuit 230 (e.g., a reading operation performed according to a read command from the host system 10). In another embodiment, the data management circuit 212 may also be integrated into the processor 211.

The memory interface control circuit 213 is configured to perform write (or, programming) operation, reading operation and erase operation for the rewritable non-volatile memory module 220 together with the data management circuit 212 under instruction of the processor 211.

For instance, the processor 211 may execute a write command sequence to instruct the memory interface control circuit 213 to write the data into the rewritable non-volatile memory module 220; the processor 211 can execute a read command sequence to instruct the memory interface control circuit 213 to read the data from one or more physical units (also referred to as target physical units) corresponding to the read command in the rewritable non-volatile memory module 220; the processor 211 can execute an erase command sequence to instruct the memory interface control circuit 213 to perform the erasing operation for the rewritable non-volatile memory module 220. Each of the write command sequence, the read command sequence and the erase command sequence may include one or more program codes or command codes, which are configured to perform the corresponding operations of writing, reading and erasing for the rewritable non-volatile memory module 220. In an embodiment, the processor 211 can further give other command sequences to the memory interface control circuit 213 so as to perform the corresponding operations for the rewritable non-volatile memory module 220.

In addition, data to be written to the rewritable non-volatile memory module 220 is converted into a format acceptable by the rewritable non-volatile memory module 220 through the memory interface control circuit 213. Specifically, when the processor 211 intends to access the rewritable non-volatile memory module 220, the processor 211 sends the corresponding command sequences to the memory interface control circuit 213 in order to instruct the memory interface control circuit 213 to perform the corresponding operations. For example, the command sequences may include the write command sequence as an instruction for writing data, the read command sequence as an instruction for reading data, the erase command sequence as an instruction for erasing data, and other corresponding command sequences as instructions for various memory operations (e.g., changing a plurality of default read voltage values of a default read voltage set for the reading operation or performing a garbage collection procedure). The command sequences may include one or more signals, or data from the bus. The signals or the data may include command codes and program codes. For example, information such as identification codes and memory addresses are included in the read command sequence.

The rewritable non-volatile memory module 220 is coupled to the storage controller 210 (the memory control circuit unit 213) and configured to store data written from the host system 10. The rewritable non-volatile memory module 220 may be a SLC (Single Level Cell) NAND flash memory module (i.e., a flash memory module capable of storing one bit in one memory cell), an MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), a QLC (Quadruple Level Cell) NAND flash memory module (i.e., a flash memory module capable of storing four bits in one memory cell), a 3D NAND flash memory module or a vertical NAND flash memory module, a vertical NAND flash memory module or a vertical NAND flash memory module other flash memory modules or any memory module having the same features. The memory cells in the rewritable non-volatile memory module 220 are disposed in an array.

In this embodiment, the rewritable non-volatile memory module 220 has a plurality of word lines, wherein each word line among the word lines includes a plurality of memory cells. The memory cells on the same word line constitute one or more physical programming units (physical pages). In addition, a plurality of physical programming units may constitute one physical unit (a physical block or a physical erasing unit). In this embodiment, the TLC (Triple Level Cell) NAND flash memory is taken as an example. That is to say, in the following embodiment, one memory cell capable of storing three bit values is used as one physical programming unit (i.e., in each programming operation, the data is programmed by applying a programming voltage one by one on the physical programming units). Here, each memory cell may be grouped into a lower physical page, a middle physical page and an upper physical page.

In this embodiment, the memory cell is used as a minimum unit for writing (programming) data. The physical unit is a minimum unit for erasing (i.e., each physical unit includes a minimum number of memory cells to be erased together). Each physical unit includes multiple memory cells. In the following embodiments, examples in which one physical block serves as one physical unit are provided. However, in another embodiment, one physical unit may also refer to a combination of any number of memory cells, depending on practical requirements. Further, it should be understood that, when the processor 211 groups the memory cells (or the physical units) in the rewritable non-volatile memory module 220 for the corresponding management operations, the memory cells (or the physical units) are logically grouped and their actual locations are not changed.

In an embodiment, the storage controller 210 further includes a buffer memory 216 and a power management circuit 217. The buffer memory is coupled to the processor 211 and configured to temporarily store data and commands from the host system 10, data from the rewritable non-volatile memory module 220 or other system data for managing the storage device 20. Accordingly, the processor 211 may rapidly access said data, commands and system data from the buffer memory 216. The power management circuit 217 is coupled to the processor 211 and configured to control power of the storage device 20.

In this embodiment, the error checking and correcting circuit 214 is coupled to the processor 211 and configured to execute an error checking and correcting procedure to ensure correctness of data. Specifically, when the processor 211 receives the write command from the host system 10, the error checking and correcting circuit 214 generates an ECC (error correcting code) and/or an EDC (error detecting code) for data corresponding to the write command, and the processor 211 writes data corresponding to the write command and the corresponding ECC and/or the EDC into the rewritable non-volatile memory module 220. Then, when the processor 211 reads the data from the rewritable non-volatile memory module 220, the corresponding ECC and/or the EDC are also read, and the error checking and correcting circuit 214 performs the error checking and correcting procedure (also referred to as a decoding operation) on the read data (also referred to as a codeword) based on the ECC and/or the EDC. In addition, after the error checking and correcting procedure is completed, if the read data is successfully decoded, the error checking and correcting circuit 214 completes the decoding operation on the data and outputs the decoded data to the processor 211 or the data management circuit 212.

In this embodiment, the decoding operation performed by the error checking and correcting circuit 214 adopts a low density parity code (LDPC) algorithm. In addition, the error checking and correcting circuit 214 includes a decoding management circuit 2141 for handling the decoding operation and an encoding management circuit 2142 for handling an encoding operation. More specifically, the error checking and correcting circuit 214 uses a bit-flipping algorithm in the LDPC algorithm to perform an iterative decoding operation multiple times for decoding the to-be-decoded codeword.

In this embodiment, the decoding operation performed by the error checking and correcting circuit 214 on one data (codeword) includes an initial syndrome calculation operation which can be used to obtain a final syndrome for determining whether the decoding is correct. Then, whether it is required to perform one or more subsequent iterative operations may be determined according to whether the decoding is correct. Each time (each round) in the end of the iterative operation, the final syndrome corresponding to the current codeword is also calculated so as to determine whether a current iterative operation is successful. If the decoding is successful (the codeword generated after the decoding is correct, i.e., a valid codeword), the current iterative operation is ended and the entire decoding operation for that codeword is also ended; if the decoding is failed (the codeword generated after the decoding is incorrect, i.e., an invalid codeword), the current iterative operation is ended, and one new (next round) iterative operation is re-started.

In this embodiment, a total number of the iterative operations performed in each decoding operation will be recorded. In each decoding operation, the iterative operation is continuously performed until the total number of the iterative operations reaches a default upper limit value. Based on demands, manufacturers can set the default upper limit value, which is not particularly limited in the invention. Details regarding the decoding method adapted to the LDPC algorithm, the decoding management circuit, and each element in the decoding management circuit in the invention are described in details below with reference to FIG. 1 to FIG. 3.

Figure 2:
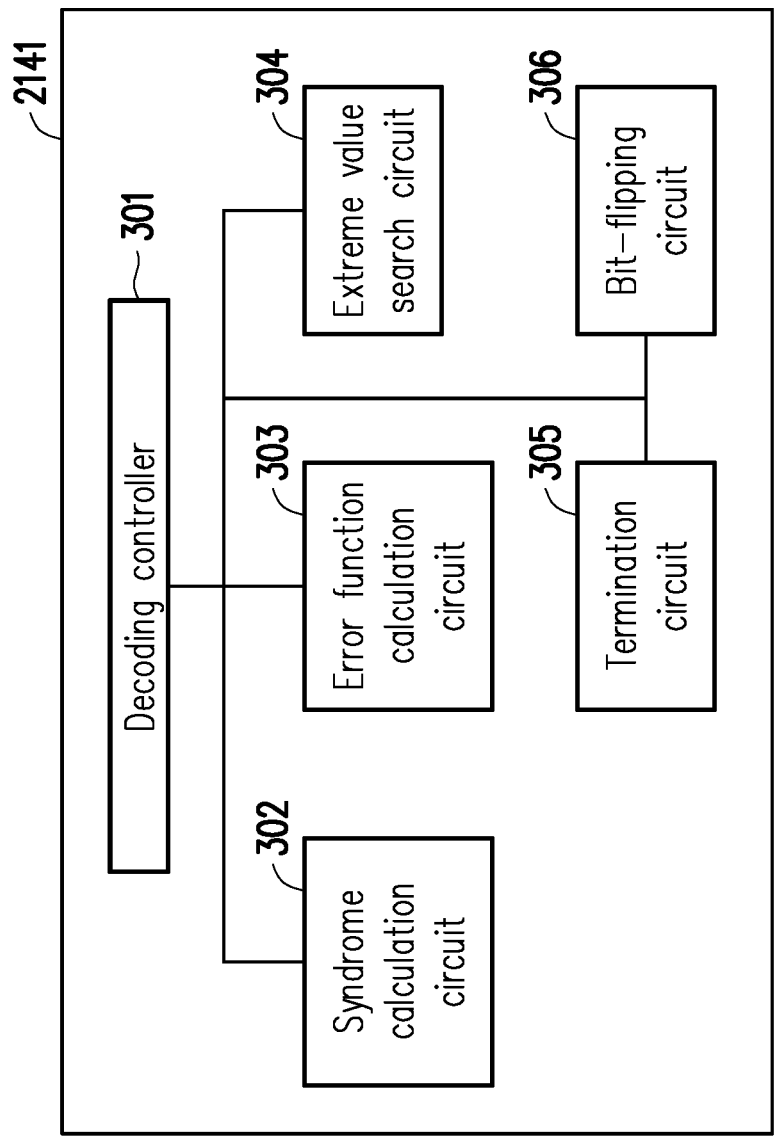
FIG. 2 is a block diagram illustrating a decoding management circuit according to an embodiment of the invention.

FIG. 2 is a block diagram illustrating a decoding management circuit according to an embodiment of the invention. With reference to FIG. 2, in this embodiment, the decoding management circuit 2141 includes a decoding controller 301, a syndrome calculation circuit 302, an error function calculation circuit 303, an extreme value search circuit 304, a termination circuit 305 and a bit-flipping circuit 306. The decoding controller 301 is coupled to the syndrome calculation circuit 302, the error function calculation circuit 303, the extreme value search circuit 304, the termination circuit 305 and the bit-flipping circuit 306, and is configured to manage overall operation of the decoding management circuit 2141. It should be noted that, in the following embodiments, operations done by each elements in the decoding management circuit 2141 may also considered as operations done by the decoding management circuit 2141. The decoding controller is configured to receive the codeword, and group a plurality of data bit values (e.g., there are n data bit values) the codeword into a plurality of data bit value sets (e.g., N data bit value sets, where N=n/z) according to a (default) parity check matrix (also referred to as a sparse parity check matrix). For example, according to a sequence of all the data bit values in the codeword, started from a first data bit value, each z data bit values are grouped into one data bit value set.

Specifically, the parity check matrix may also be referred to as the sparse parity check matrix, which is a matrix composed of M*N parity check sub-matrices. The parity check sub-matrices may also be referred to as a right shifted identity matrix. z is a matrix size of the parity check sub-matrix of the parity check matrix (e.g., the parity check sub-matrix is a matrix with a size of z*z), and a total number of the data bit value of each data bit value set is z. The data bit value includes a bit value "0" and a bit value "1".

The syndrome calculation circuit 302 is configured to sequentially perform syndrome calculation operations respectively on the data bit value sets according to the sequence of the data bit value sets, so as to obtain a plurality of temporary syndromes and the final syndrome.

The error function calculation circuit 303 is configured to sequentially perform error function calculation operations on the data bit value sets according to the sequence of the data bit value sets and the final syndrome. That is to say, $E[G_1]$ is used to denote an error value set (e.g., $E_{G1}$: $\{E_{y1}, E_{y2}, \ldots, E_{yz}\}$) corresponding to a first data bit value set $G_1$ (e.g., $\{y1\sim yz\}$). Here, an error value corresponding to the first data bit value y1 of the first data bit value set $G_1$ is, for example, $E_{y1}$. More specifically, if the error function calculation adopts a WBF (Weighted Bit Flipping) algorithm, an error value $E_{yk}$ corresponding to a k-th data bit value yk of the first data bit value set $G_1$ may be calculated by, for example, an error value calculation formula provided below:

$$E_{yk} = \sum_{i \in M(yk)} (1 - 2S_i) \times W_i, \quad W_i = \min_{j \in N(l)} |y_j|$$

Here, M(yk) is used to denote a number of rows where the bit value "1" appears in a k-th column of the parity check matrix identified according to a sequence of the k-th data bit value (i.e., yk), (for example, in correspondence to the data bit value y1, searching for rows in the first column of the parity check matrix where the bit value "1" appears). Based on the above, corresponding values $S_i$ may be identified in the final syndrome according to the number of rows (i.e., i, which may be an integer greater than or equal to 0). $W_i$ is a corresponding weight.

It should be noted that, the invention is not limited to use only the bit-flipping algorithm and the corresponding error value calculation formula. For example, in other embodiments, various error value calculation formulae using other algorithms for the bit-flipping operation such as a MWBF (Modified Weighted Bit Flipping) algorithm, an IMWBF (Improved Modified Weighted Bit Flipping) algorithm, a RRBF (Reliability Ratio Weighted Bit Flipping) algorithm, or a GDBF (Gradient Decent Bit Flipping) algorithm, may also be used in the error function calculation operation. Aforementioned formulae corresponding to various bit-flipping algorithms belong to the prior art in the field, and thus related description is omitted herein.

The extreme value circuit 304 is configured to perform an extreme value search operation. More specifically, after each error function calculation operation corresponding to the data bit value set is completed and the corresponding error value set is obtained, the extreme value search circuit 304 performs the extreme value search operation on the error values in that error value set, so as to search for a maximum value or a minimum value therein based on settings.

The termination circuit 305 is configured to determine whether to end the decoding operation performed on the current codeword according to the latest obtained final syndrome corresponding to the codeword.

The bit-flipping circuit 306 is configured to perform a bit-flipping operation. More specifically, according to the sequence of the data bit value sets, started from the first data bit value set, the bit-flipping circuit 306 determines whether to flip the data bit values in one data bit value set according to an error threshold. Specifically, the error threshold may represent a confidence threshold, and the bit-flipping circuit 306 flips the data bit value with a confidence level not exceeding the confidence threshold. The operation of "flipping" the data bit value is to change the bit value from a first bit value (e.g., "0") to a second bit value (e.g., "1"), or change the data bit value from the second bit value to the first bit value. In other words, when one data bit value is to be flipped (the data bit value may have two bit values), it means to change the bit value of the data bit value from a current bit value to another bit value.

Figure 3:
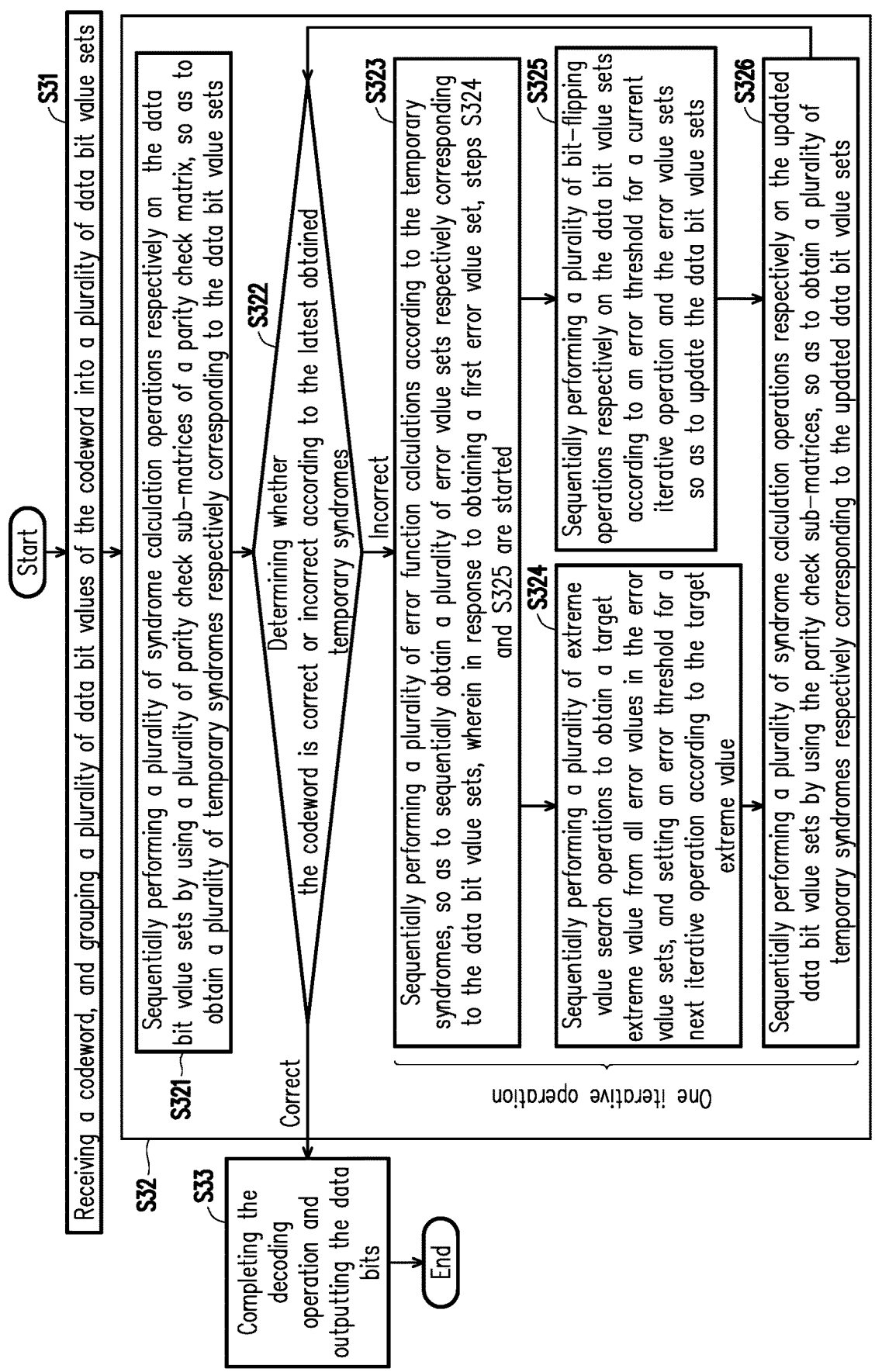
FIG. 3 is a flowchart illustrating a decoding method according to an embodiment of the invention.
Figure 5:
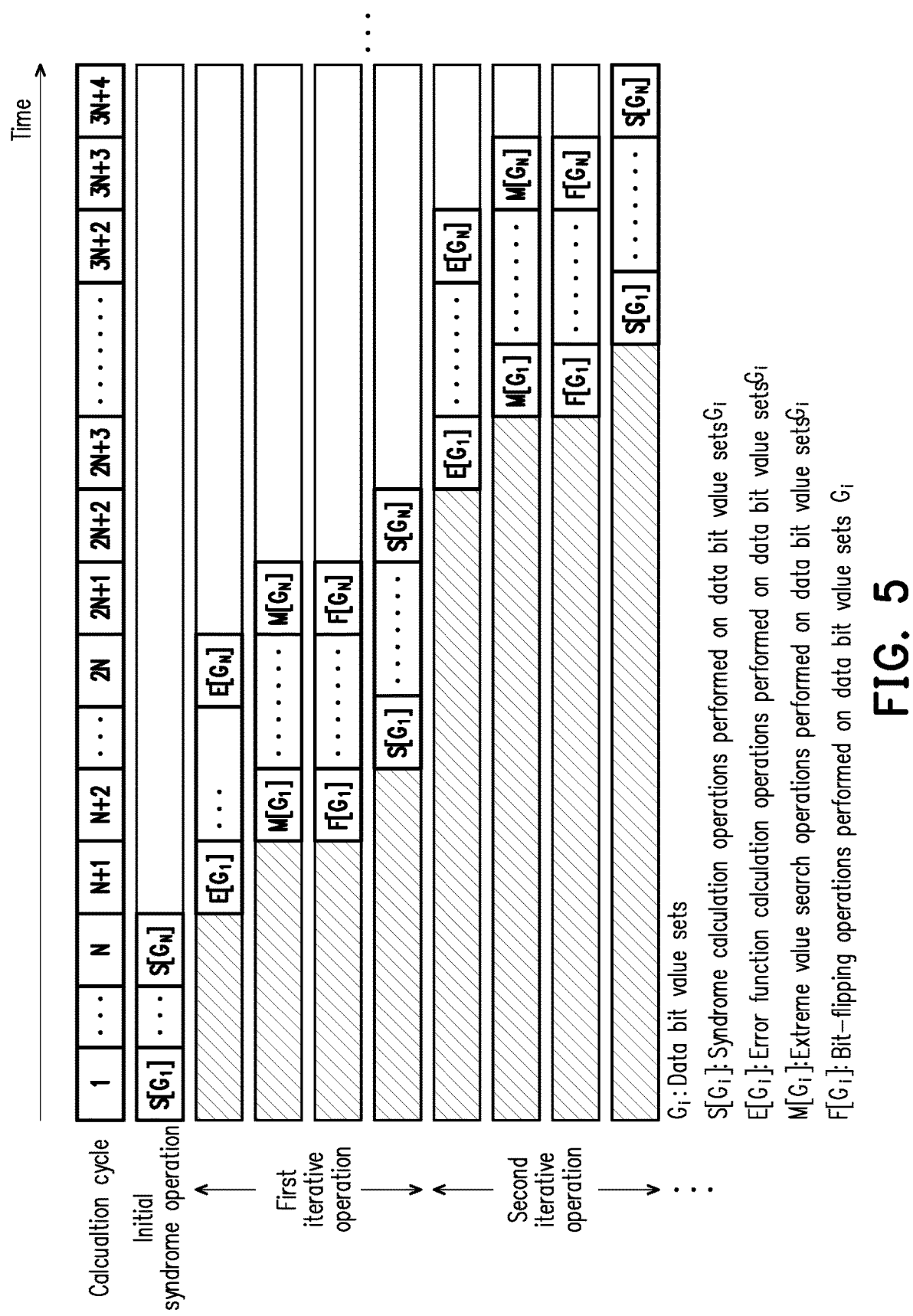
FIG. 5 illustrates a schematic timing diagram of a decoding operation according to an embodiment of the invention.

FIG. 3 is a flowchart illustrating a decoding method according to an embodiment of the invention. FIG. 5 illustrates a schematic timing diagram of a decoding operation according to an embodiment of the invention. Referring to FIG. 2, FIG. 3 and FIG. 5 together, in a step S31, the error checking and correcting circuit 214 receives a codeword, and groups a plurality of data bit values of the codeword into a plurality of data bit value sets. More specifically, the decoding management circuit 2141 (e.g., the decoding controller 301), as described above, may group the data bit values of the codeword according to the size of the parity check sub-matrices of the (default) parity check matrix.

Next, in a step S32, the error checking and correcting circuit 214 performs a decoding operation on the data bit value sets. In this embodiment, at the beginning of the decoding operation, the decoding controller 301 instructs the syndrome calculation circuit 302 to perform a syndrome calculation operation (also referred to as the initial syndrome operation) respectively on the grouped data bit value set $G_1$ to $G_N$ according to the parity check matrix. That is, in a step S321, the syndrome calculation circuit 302 sequentially performs a plurality of syndrome calculation operations respectively on the data bit value sets by using a plurality of parity check sub-matrices of a parity check matrix, so as to obtain a plurality of temporary syndromes respectively corresponding to the data bit value sets.

For instance, in a syndrome calculation operation $S[G_1]$ performed on the first data bit value set $G_1$, the syndrome calculation circuit 302 performs a matrix multiplication on the parity check sub-matrices located on the first column among the parity check sub-matrices respectively with the data bit value set $G_1$, so as to obtain a temporary syndrome $S_{tmp1}$ corresponding to the first data bit value set $G_1$. Next, in a syndrome calculation operation $S[G_2]$ performed on the second data bit value set $G_2$, the syndrome calculation circuit 302 performs the matrix multiplication on the parity check sub-matrices located on the second column among the parity check sub-matrices respectively with the data bit value set $G_2$, so as to obtain a temporary syndrome $S_{tmp2}$ corresponding to the second data bit value set $G_2$. By analogy, the syndrome calculation circuit 302 may obtain the temporary syndromes $S_{tmp1}$ to $S_{tmpN}$ respectively corresponding to the data bit value sets $G_1$ to $G_N$ through the syndrome operations $S[G_1]$ to $S[G_N]$. A time taken to perform one of the syndrome calculation operations $S[G_1]$ to $S[G_N]$ is one calculation circle. A time length of one calculation cycle is not limited by the invention.

Lastly, in response to obtaining all the temporary syndromes $S_{tmp1}$ to $S_{tmpN}$, the syndrome calculation circuit 302 performs an XOR operation on the temporary syndromes $S_{tmp1}$ to $S_{tmpN}$ according to an order of the temporary syndromes $S_{tmp1}$ to $S_{tmpN}$ such that a final syndrome $S_{fin}$ may be calculated and obtained. For example, the syndrome calculation circuit 302 first performs the XOR operation on the temporary syndrome $S_{tmp1}$ and the temporary syndrome $S_{tmp2}$ to obtain a calculation result. Next, the XOR operation is performed on said calculation result and the temporary syndrome $S_{tmp3}$ arranged after the temporary syndrome $S_{tmp2}$ to obtain another calculation result. By analogy, the above process repeats until the XOR operation is performed with the last temporary syndrome $S_{tmpN}$ to obtain the last calculation result, which is also known as the final syndrome $S_{fin}$. The XOR operation performed per each two temporary syndromes may be performed in the calculation cycle of the last syndrome calculation, and may be distributed over the calculation cycles (e.g., the calculation cycles 1 to N) corresponding to each of the syndrome calculations (e.g., the XOR operation is performed on the temporary syndrome $S_{tmp1}$ and the temporary syndrome $S_{tmp2}$ when obtaining the temporary syndrome $S_{tmp2}$).

In other words, after all the temporary syndromes respectively corresponding to the data bit value sets $G_1$ to $G_N$ are obtained, the syndrome calculation circuit 302 may calculate and obtain the final syndrome $S_{fin}$ corresponding to the data bit value sets $G_1$ to $G_N$. Next, in a step S322, the termination circuit 305 determines whether the codeword is correct or incorrect according to the latest obtained temporary syndromes. Specifically, the termination circuit 305 determines whether a plurality of values corresponding to the final syndrome $S_{fin}$ corresponding to the data bit values $G_1$ to $G_N$ are all zero. If the values of the final syndrome $S_{fin}$ are all zero (i.e., "0"), the codeword is determined as correct and the method proceeds to a step S33; If the values of the final syndrome $S_{fin}$ are not all zero (i.e., with one or more "1" included), the codeword is determined as incorrect, and the method proceeds to a step S323. In the step S33, the termination circuit 305 determines to complete the decoding operation (and the decoding is successful) and output the data bits. In other words, the termination circuit 305 may determine whether end the entire current decoding operation according to the latest final syndrome obtained each time.

In this embodiment, the process of the step S323 to step S326 may be referred to as one (one round) iterative operation. Here, at the beginning of the iterative operation, that is, in the step S323, the error function calculation circuit 303 sequentially performs a plurality of error function calculations according to the temporary syndromes, so as to sequentially obtain a plurality of error value sets respectively corresponding to the data bit value sets, wherein in response to obtaining a first error value set, the steps S324 and S325 are started. Specifically, as described above, according to the sequence of the data bit value sets, the error function calculation circuit 303 respectively calculates the corresponding error value set for each of the data bit sets according to the final syndrome (which are calculated and obtained from the temporary syndromes) and the default error value calculation formula corresponding to the bit-flipping. That is, each of the error values corresponding to the data bit values is calculated and obtained. For example, in an (N+1)-th calculation cycle, the error function calculation circuit 303 performs an error function calculation operation (i.e., an error function calculation operation $E[G_1]$) on the first data bit value set $G_1$, and obtains an error value set $E_{G1}$ (e.g., $\{E_{y1}, E_{y2}, \ldots, E_{yz}\}$) corresponding to the first data bit value set $G_1$ (e.g., $\{y1\sim yz\}$). By analogy, in a (2N)-th calculation cycle, the error function calculation circuit 303 performs an error function calculation operation (i.e., an error function calculation operation $E[G_N]$) on an N-th data bit value set $G_N$, and obtains an error value set $E_{GN}$ corresponding to the N-th data bit value set $G_N$ (e.g., z data bit values arranged at the end of the data bit values y1 to yn).

It should be noted that, after the corresponding first error value set is obtained, the decoding controller 301 instructs the extreme value search circuit 304 to perform an extreme value search calculation operation (the step S324), and instructs the bit-flipping circuit 306 to simultaneously perform a bit-flipping operation (the step S325). In other words, for example, in an (N+2)-th calculation cycle, the extreme value search circuit 304 starts to perform the extreme value search calculation operation on the error value set corresponding to the data bit value set $G_1$; the bit-flipping circuit 306 starts to perform the bit-flipping operation on the data bit value set $G_1$. In addition, the error function calculation circuit 303 also continues to perform an error function calculation operation (i.e., an error function calculation operation $E[G_2]$) on the data bit value set $G_2$ and obtain an error value set $E_{G2}$ corresponding to the data bit value set $G_2$.

In the step S324, the extreme value search circuit 304 sequentially performs a plurality of extreme value search operations to obtain a target extreme value from all error values in the error value sets, and sets an error threshold for a next iterative operation according to the target extreme value.

Specifically, if the error value calculation formula is "$(1-2S_i)$", the smaller the error value is, the less the corresponding data bit value can be trusted (the confidence level is lower). In this case, the extreme value to be searched by the extreme value search operation is the smallest one of the error values among all the error value sets.

In the (N+2)-th calculation cycle, the extreme value search circuit 304 first performs the extreme value search operation (i.e., an extreme value search operation $M[G_1]$) on the data bit value set $G_1$ (which is the data bit value set arranged at the first place) so as to search for a minimum error value (i.e., an error value $E_{G1min}$) from the error values in the error value set $E_{G1}$ corresponding to the data bit value set $G_1$. At the time, the error value $E_{G1min}$ may be referred to as a local target error value, or a global target error value.

Next, in an (N+3)-th calculation cycle, the extreme value search circuit 304 performs an extreme value search operation $M[G_2]$ on the data bit value set $G_2$ to search for the minimum error value from the error values in the error value set $E_{G2}$ corresponding to the data bit value set $G_2$, compares the minimum error value $E_{G2min}$ corresponding to the data bit value set $G_2$ with the minimum error value $E_{G1min}$ corresponding to the previous data bit value set $G_1$, and uses a smaller among the two as a global smallest error value (also referred to as the global target error value).

In other words, the step of sequentially performing the extreme value search operations on the error value sets to identify the target extreme value from all the error values in the error value sets may include the following steps: (1) selecting a target error value set not yet selected (e.g., the error value set $E_{G1}$ in the first extreme value search operation) according to a sequence of the error value sets, performing the extreme value search operation on the target error value set to identify a minimum value among a plurality of error values in the target error value set, and using the minimum value as a local target error value (e.g., the error value $E_{G1min}$) corresponding to the target error value set; (2) if a global target error value already exists, using a smaller one of the local target error value and the global target error value as a new global target error value (e.g., comparing the error value $E_{G1min}$ with the error value $E_{G2min}$ to find a smaller one among them, and using it (the smaller one) as the new global target error value), wherein if the global target error value does not exist, using the local target error value as the new global target error value (e.g., the error value $E_{G1min}$ is first used as the global target error value before the extreme value search operation is performed on the error value $E_{G2}$); and (3) if the error value sets include a error value set not yet selected for the extreme value search operation, performing the step (1) (i.e., another extreme value search operation is sequentially performed on the error value set to which the extreme value search operation is not yet performed), wherein if the error value sets do not include the error value set not yet selected for the extreme value search operation, the extreme value search operations corresponding to all the error value sets are determined as completed, and the latest global target error value is identified as the target extreme value (i.e., the target extreme value identified through the extreme value search operations is the smallest one among all the error values).

Conversely, if the error value calculation formula is "$(2S_i-1)$", the greater the error value is, the less the corresponding data bit value can be trusted (the confidence level is lower). In this case, the extreme value to be searched by the extreme value search operation is the greatest one of the error values among all the error value sets (i.e., the finally identified target value is the greatest one among the all the error values). The decoding controller 301 may record such target extreme value.

In addition, if the error value calculation formula is "$(1-2S_i)$", the step of "setting the error threshold for the next iterative operation according to the target extreme value" in the step S324 includes: if an absolute difference between the target extreme value and zero is not less than a predetermined offset value, the decoding controller 301 sets a sum obtained from the target extreme value "plus" a predetermined acceleration value as the error threshold for the next iterative operation; and if the absolute difference between the target extreme value and zero is less than a predetermined offset value, the decoding controller 301 directly sets the target extreme value as the error threshold for the next iterative operation. Manufacturers may set up the predetermined acceleration value (e.g., "1") and the determined offset value in advance based on demands. In other words, the error threshold for the next iterative operation is determined according to the target extreme value identified from the current iterative operation. The decoding controller 301 may further determine whether to adjust the target extreme value or not according to the absolute difference between the target extreme value and zero. Accordingly, when the target extreme value is smaller (farther from zero), the error threshold may be set to be greater than the target extreme value so more data bit values may be flipped in the subsequent iterative operations; when the target extreme value is greater (closer to zero), the error threshold may be directly set as the extreme value.

Conversely, if the error value calculation formula is "$(2S_i-1)$", the step of "setting the error threshold for the next iterative operation according to the target extreme value" in the step S324 includes: if an absolute difference between the target extreme value and zero is not less than a predetermined offset value, a sum obtained from the target extreme value "minus" a predetermined acceleration value is set as the error threshold for the next iterative operation; and if the absolute difference between the target extreme value and zero is less than a predetermined offset value, the target extreme value is directly set as the error threshold for the next iterative operation.

Details recording "the error threshold for the next iterative operation" and "the error threshold for the current iterative operation" are described as follows.

In this embodiment, as described above, the target extreme value of the current iterative operation may be used to set the error threshold "for the next iterative operation".

In addition, the error threshold "for the current (present-round) iterative operation" may be determined through the target extreme value of the previous (previous-round) iterative operation; or in the case where the previous iterative operation is absent (the current iterative operation is the first iterative operation), the error threshold for the current (present-round) iterative operation may be a predetermined error threshold set in advance. Manufacturers may set the predetermined error threshold according to their own experimental results, or the decoding controller 301 may set the predetermined error threshold according to the error threshold in the decoding operation previously performed.

In the step S325, the bit-flipping circuit 306 sequentially performs a plurality of bit-flipping operations respectively on the data bit value sets according to an error threshold for a current iterative operation and the error value sets so as to update the data bit value sets.

Specifically, if the error value calculation formula is "$(1-2S_i)$", the smaller the error value is, the less the corresponding data bit value can be trusted (the confidence level is lower), as described above. In this case, the data bit values to be flipped by the bit-flipping operation are the data bit values corresponding to the error values less than or equal to the error threshold (also referred to as the confidence threshold).

For example, in the (N+2)-th calculation cycle, the bit-flipping circuit 306 first performs the bit-flipping operation (i.e., a bit-flipping operation $F[G_1]$) on the data bit value set $G_1$ (the data bit value set arranged at the first place), so as to identify error values less than or equal to the error threshold (also referred to as target error values) among the error values in the error value set $E_{G1}$ corresponding to the data bit value set $G_1$. If one or more target error values less than or equal to the error threshold are identified (exist), the bit-flipping circuit 306 flips one or more target data bit values corresponding to said one or more target error values among the data bit values in the data bit value set $G_1$ according to said one or more target error values, so as to complete the bit-flipping operation corresponding to the data bit value set $G_1$ (i.e., the data bit value set $G_1$ is updated).

Next, in the (N+3)-th calculation cycle, the bit-flipping circuit 306 performs a bit-flipping operation $F[G_2]$ on the data bit value set $G_2$ according to the error threshold "for the current iterative operation", so as identify the error values less than or equal to the error threshold (also referred to as the target error values) among the error values in the error value set $E_{G2}$ corresponding to the data bit value set $G_2$. If one or more target error values less than or equal to the error threshold are identified (exist), the bit-flipping circuit 306 flips one or more target data bit values corresponding to said one or more target error values among the data bit values in the data bit value set $G_2$ according to said one or more target error values, so as to complete the bit-flipping operation corresponding to the data bit value set $G_2$. By analogy, the above process repeats until the bit-flipping operations corresponding to all the data bit value sets are completed.

In other words, the step S325 may include the following steps: (1) according to a sequence of the data bit value sets, the bit-flipping circuit 306 selects a target data bit value set not yet selected (e.g., the first data bit value set $G_1$ is selected in a first bit-flipping operation), and identifies a target error value set corresponding to the target data bit value set among the error value sets (e.g., the error value set $E_{G1}$ corresponding to the data bit value set $G_1$); (2) the bit-flipping circuit 306 determines whether one or more target error values less than or equal to the error threshold exist in a plurality of error values of the target error value set according to the error threshold; (3) if said one or more target error values less than or equal to the error threshold exist, the bit-flipping circuit 306 flips one or more target data bit values corresponding to said one or more target error values in the target data bit value set according to said one or more target error values, so as to complete the bit-flipping operation corresponding to the target data bit value set; and (4) if the data bit value sets include the data bit value set not yet selected for the bit-flipping operation, performing the step (1) (e.g., after the bit-flipping operation $F[G_1]$ corresponding to the data bit value set $G_1$ is completed, the step (1) is performed to select the data bit value set $G_2$, which is not yet selected, for another bit-flipping operation), wherein if the data bit value sets do not include the data bit value set not yet selected for the bit-flipping operation, the bit-flipping operations of all the data bit value sets are determined as completed.

Conversely, if the error value calculation formula is "$(2S_i-1)$", the greater the error value is, the less the corresponding data bit value can be trusted (the confidence level is lower). In this case, the data bit values to be flipped by the bit-flipping operation are the data bit values corresponding to the error values greater than or equal to the error threshold (with the confidence level less than or equal to the confidence threshold). That is to say, the error value of each of the data bit values to be flipped is greater than or equal to the error threshold for the current iterative operation.

After all the bit-flipping operations are completed, the data bit value sets are also all updated.

In this embodiment, in response to completing the bit-flipping operation $F[G_1]$ for the first bit-flipping operation $G_1$, the step S326 is simultaneously performed, i.e., a plurality of syndrome calculation operations are sequentially performed respectively on the updated data bit value sets by using the parity check sub-matrices, so as to obtain a plurality of temporary syndromes respectively corresponding to the updated data bit value sets. The step S326 is similar the step S321, and their difference lies where: in the step S326, a plurality of syndrome calculation operations (e.g., the syndrome calculation operation $S[G_1]$ to $S[G_N]$ started from the calculation cycle "N+3") are performed respectively on the updated data bit value sets $G_1$ to $G_N$. In addition, after all the temporary syndrome respectively corresponding to the updated data bit value sets $G_1$ to $G_N$ are obtained, the syndrome calculation circuit 302 may also calculate and obtain the final syndrome $S_{fin}$ corresponding to the updated data bit value sets $G_1$ to $G_N$, end the current iterative operation, and proceed to the step S323 for determining whether to perform the next iterative operation.

It is worth noting that, the error threshold, the updated data bit value sets, and the corresponding temporary syndromes obtained from the current iterative operation are used in the next iterative operation.

It should be noted that, in this embodiment, when the bit-flipping operation are started, the extreme value search operations are not all completed. In addition, a time point for starting the bit-flipping operations is identical to a time point for starting the extreme value search operation. Accordingly, compared to the traditional approach, with respect to the overall time taken by the iterative operations of this embodiment, all the bit-flipping operations may be performed instead of waiting for all the extreme value search operations to complete so the overall time taken can be shortened.

Figure 4:
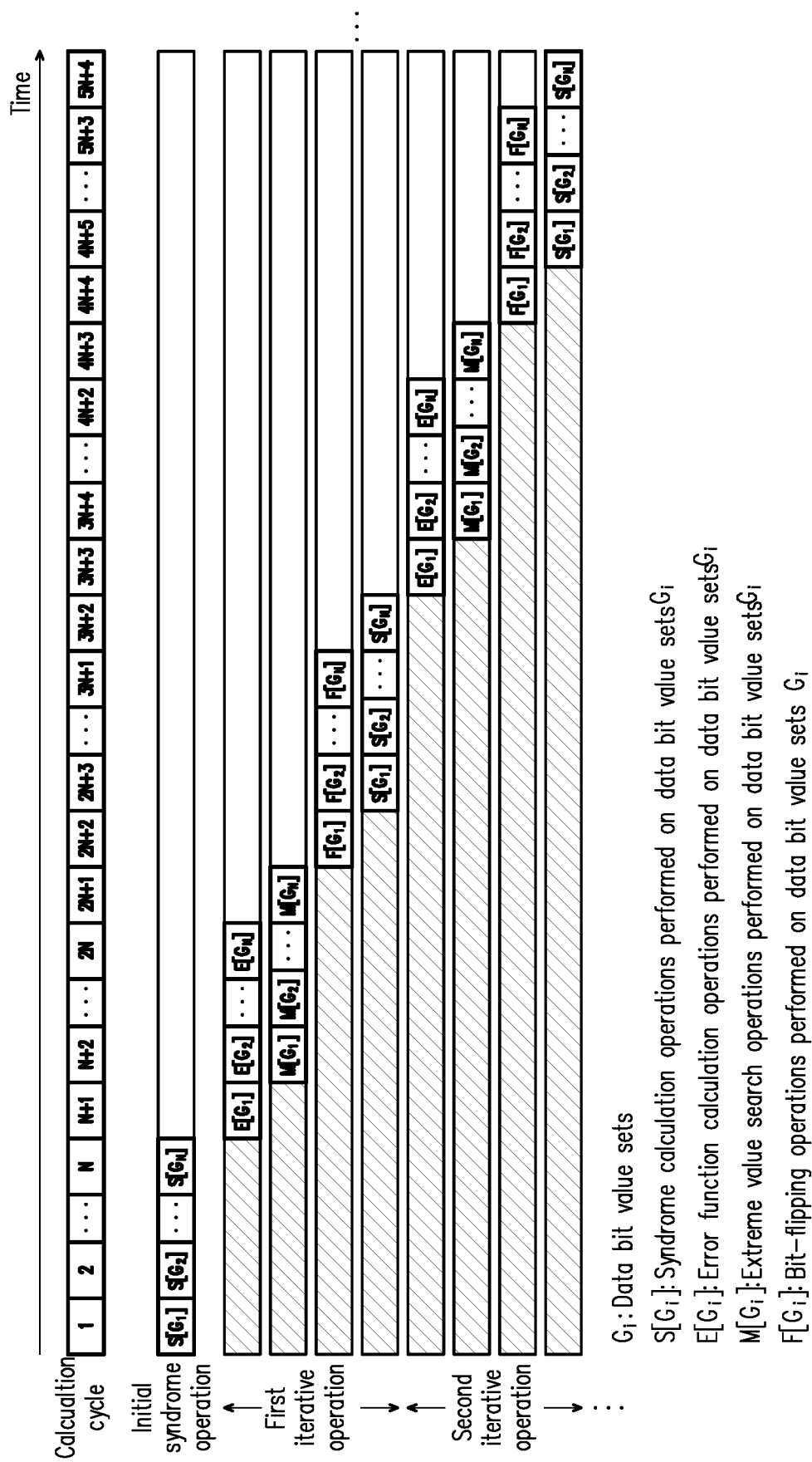
FIG. 4 illustrates a schematic timing diagram of a decoding operation according to a traditional approach.

Referring to FIG. 4 and FIG. 5, for instance, it is assumed that the iterative operation is performed X times. In the traditional approach, the entire duration (a total of calculation cycles) of each decoding operation is N+X(2N+2) calculation cycles; however, with the decoding method provided by the invention, the entire duration (a total of calculation cycles) of each decoding operation is N+X(N+2) calculation cycles. In other words, if the iterative operation is performed X times, the decoding method provided by the invention can shorten X*N operation cycles in total to provide a significant improvement.

In summary, the decoding method and the storage controller provided by the embodiments of the invention can perform all the bit-flipping operations while still performing the extreme value search operations instead of waiting for all the extreme value search operations to complete. As a result, the overall time taken each time when the iterative operation is performed may be shortened to improve decoding efficiency and enhance work efficiency.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A decoding method comprising functions configured to be performed by a storage device comprising a rewritable non-volatile memory and a processor coupled to the rewriteable non-volatile memory and the configured to control an error checking and correcting circuit, wherein the error checking and correcting circuit comprises a decoder controller and a plurality of circuits coupled to the decoder controller configured to perform the functions comprising:

receiving a codeword by the error checking and correcting circuit, grouping a plurality of data bits of the codeword into a plurality of data bit value sets, and performing a decoding operation on the plurality of data bit value sets by the error checking and correcting circuit, the decoding operation comprising following steps:

step (1) sequentially performing a plurality of syndrome calculation operations respectively on the plurality of data bit value sets by using a plurality of parity check sub-matrices of a parity check matrix, so as to obtain a plurality of temporary syndromes respectively corresponding to the plurality of data bit value sets, and performing a step (2) after all the plurality of temporary syndromes respectively corresponding to the plurality of data bit value sets are obtained;

step (2) determining whether the codeword is correct or incorrect according to the latest obtained plurality of temporary syndromes, wherein if the codeword is determined as correct, the decoding operation is completed and the data bits are outputted, wherein if the codeword is determined as incorrect, a step (3) is performed to start one new iterative operation;

step (3) sequentially performing a plurality of error function calculations according to the plurality of temporary syndromes, so as to sequentially obtain a plurality of error value sets respectively corresponding to the plurality of data bit value sets, wherein in response to obtaining a first error value set, steps (4) and (5) are performed simultaneously;

step (4) sequentially performing a plurality of extreme value search operations on the error value sets to identify a target extreme value from all error values in the error value sets, and setting a second error threshold for a next iterative operation according to the target extreme value;

step (5) sequentially performing a plurality of bit-flipping operations respectively on the plurality of data bit value sets according to a first error threshold for a current iterative operation and the error value sets so as to update the plurality of data bit value sets as updated data bit value sets, wherein if the current iterative operation is a first iterative operation, the first error threshold for the current iterative operation is a predetermined error threshold, wherein if the current iterative operation is not the first iterative operation, the first error threshold for the current iterative operation is an error threshold identified in a previous iterative operation, wherein in response to completing a first bit-flipping operation, a step (6) is performed simultaneously, wherein the processor is configured to control the error checking and connecting circuit to perform an error function calculation on a second data bit value set to obtain a second error value set corresponding to the second data bit value set, an extreme value search operation on a first data bit value set, and the first bit-flipping operation on the first error value set simultaneously to shortened the decoding operation on the plurality of data bit value sets stored in the rewritable non-volatile memory;

step (6) sequentially performing a plurality of syndrome calculation operations respectively on the updated data bit value sets by using the parity check sub-matrices, so as to obtain an updated plurality a temporary syndromes respectively corresponding to the updated data bit value sets, wherein in response to obtaining all the plurality of temporary syndromes respectively corresponding to the updated data bit value sets, the current iterative operation is completed and the step (2) is performed, wherein each of said iterative operations comprises the steps (2) to (6), wherein the updated data bit value sets, the corresponding plurality of temporary syndromes and the first error threshold obtained from the current iterative operation are used in the next iterative operation, wherein the step (2) comprises:

sequentially performing an XOR calculation by the error checking and correcting circuit on the plurality of temporary syndromes to obtain a final syndrome, wherein if a plurality of values of the final syndrome are all zero, the codeword is determined as correct, wherein if the values of the final syndrome are not all zero, the codeword is determined as incorrect.

2. The decoding method as recited in claim 1, wherein the step (5) comprises:

step (5-1) selecting a target data bit value set not yet selected according to a sequence of the plurality of data bit value sets, and identifying a target error value set corresponding to the target data bit value set in the error value sets;

step (5-2) determining whether one or more target error values less than or equal to the first error threshold exist in a plurality of error values of the target error value set according to the first error threshold;

step (5-3) if said one or more target error values less than or equal to the first error threshold exist, flipping one or more target data bit values corresponding to said one or more target error values in the target data bit value set according to said one or more target error values, so as to complete the bit-flipping operation corresponding to the target data bit value set; and step (5-4) if the plurality of data bit value sets include the data bit value set not yet selected for the bit-flipping operation, performing the step (5-1), wherein if the plurality of data bit value sets do not include the data bit value set not yet selected for the bit-flipping operation, the bit-flipping operations of all the plurality of data bit value sets are determined as completed.

3. The decoding method as recited in claim 1, wherein the step of sequentially performing the extreme value search operations on the error value sets to identify the target extreme value from all the error values in the error value sets in the step (4) comprises:

step (4-1) selecting a target error value set not yet selected according to a sequence of the error value sets, performing the extreme value search operation on the target error value set to identify a minimum value among a plurality of error values in the target error value set, and using the minimum value as a local target error value corresponding to the target error value set;

step (4-2) if a global target error value already exists, using a smaller one of the local target error value and the global target error value as a new global target error value, wherein if the global target error value does not exist, the local target error value is used as the new global target error value; and step (4-3) if the error value sets include an error value set not yet selected for the extreme value search operation, performing the step (4-1), wherein if the error value sets do not include any error value set not yet selected for the extreme value search operation, the extreme value search operations corresponding to all the error value sets are determined as completed, and the latest global target error value is identified as the target extreme value.

4. The decoding method as recited in claim 3, wherein the step of setting the second error threshold for the next iterative operation according to the target extreme value in the step (4) comprises:

if an absolute difference between the target extreme value and zero is not less than a predetermined offset value, the processor is configured to control the error checking and correcting circuit to set a sum obtained from the target extreme value plus a predetermined acceleration value as the second error threshold for the next iterative operation; and if the absolute difference between the target extreme value and zero is less than a predetermined offset value, the processor is configured to control the error checking and correcting circuit to directly set the target extreme value as the second error threshold for the next iterative operation.

5. The decoding method as recited in claim 1, wherein the step (5) comprises:

step (5-1) selecting a target data bit value set not yet selected according to a sequence of the plurality of data bit value sets, and identifying a target error value set corresponding to the target data bit value set in the error value sets;

step (5-2) determining whether one or more target error values greater than or equal to the first error threshold exist in a plurality of error values of the target error value set according to the first error threshold;

step (5-3) if said one or more target error values greater than or equal to the first error threshold exist, flipping one or more target data bit values corresponding to said one or more target error values in the target data bit value set according to said one or more target error values, so as to complete the bit-flipping operation corresponding to the target data bit value set; and step (5-4) if the plurality of data bit value sets include the data bit value set not yet selected for the bit-flipping operation, performing the step (5-1), wherein if the plurality of data bit value sets do not include the data bit value set not yet selected for the bit-flipping operation, the bit-flipping operations of all the plurality of data bit value sets are determined as completed.

6. The decoding method as recited in claim 1, wherein the step of sequentially performing the extreme value search operations on the error value sets to identify the target extreme value from all the error values in the error value sets in the step (4) comprises:
- step (4-1) selecting a target error value set not yet selected according to a sequence of the error value sets, performing the extreme value search operation on the target error value to identify a maximum value among a plurality of error values in the target error value set, and using the maximum value as a local target error value corresponding to the target error value set;
- step (4-2) if a global target error value already exists, using a greater one of the local target error value and the global target error value as a new global target error value, wherein if the global target error value does not exist, the local target error value is used as the new global target error value; and
- step (4-3) if the error value sets include an error value set not yet selected for the extreme value search operation, performing the step (4-1), wherein if the error value sets do not include any error value set not yet selected for the extreme value search operation, the extreme value search operations corresponding to all the error value sets are determined as completed, and the latest global target error value is identified as the target extreme value.

7. The decoding method as recited in claim 6, wherein the step of setting the second error threshold for the next iterative operation according to the target extreme value in the step (4) comprises:
- if an absolute difference between the target extreme value and zero is not less than a predetermined offset value, the processor is configured to control the error checking and collecting circuit to set a difference obtained from the target extreme value minus a predetermined acceleration value as the second error threshold for the next iterative operation; and
- if the absolute difference between the target extreme value and zero is less than a predetermined offset value, the processor is configured to control the error checking and correcting circuit to directly set the target extreme value as the second error threshold for the next iterative operation.

8. The decoding method as recited in claim 1, wherein the step (3) comprises:
- step (3-1) selecting a target data bit value set not yet selected in the plurality of data bit value sets according to a sequence of the plurality of data bit value sets, and identifying a plurality of target data bit values of the target data bit value sets;
- step (3-2) performing the error function calculation corresponding to the target data bit value set according to the final syndrome obtained from the plurality of temporary syndromes and a predetermined error value calculation formula, so as to calculate a plurality of error values respectively corresponding to the target data bit values, and using the error values respectively corresponding to the target data bit values as an error value set corresponding to the target data bit value set; and
- step (3-3) if the plurality of data bit value sets include the data bit value set not yet selected for the error function calculation, performing the step (3-1), wherein if the plurality of data bit value sets do not include the data bit value set not yet selected for the error function calculation, the plurality of error function calculations corresponding to all the plurality of data bit value sets are determined as completed.

9. A storage controller, configured to control a storage device having a rewritable non-volatile memory module, the storage controller comprising:
- a memory interface control circuit, configured to couple to the rewritable non-volatile memory module,
- an error checking and correcting circuit comprising a decoder controller and a plurality of circuits coupled to the decoder controller; and
- a processor, coupled to the error checking and correcting circuit and the memory interface control circuit, wherein the memory interface control circuit transmits a codeword read from the rewritable non-volatile memory module to the error checking and correcting circuit,
- wherein the error checking and correcting circuit is configured to receive the codeword, group a plurality of data bits of the codeword into a plurality of data bit value sets, and perform a decoding operation on the plurality of data bit value sets, wherein in the performed decoding operation, the error checking and correcting circuit is configured to perform following operations:
- step (1) the error checking and correcting circuit is configured to sequentially perform a plurality of syndrome calculation operations respectively on the plurality of data bit value sets by using a plurality of parity check sub-matrices of a parity check matrix, so as to obtain a plurality of temporary syndromes respectively corresponding to the plurality of data bit value sets, and perform a step (2) after all the plurality of temporary syndromes respectively corresponding to the plurality of data bit value sets are obtained;
- step (2) the error checking and correcting circuit is configured to determine whether the codeword is correct or incorrect according to the latest obtained plurality of temporary syndromes, wherein if the codeword is determined as correct, the decoding operation is completed and the data bits are outputted, wherein if the codeword is determined as incorrect, a step (3) is performed to start one new iterative operation;
- step (3) the error checking and correcting circuit is configured to sequentially perform a plurality of error function calculations according to the plurality of temporary syndromes, so as to sequentially obtain a plurality of error value sets respectively corresponding to the plurality of data bit value sets, wherein in response to obtaining a first error value set, steps (4) and (5) are performed simultaneously;
- step (4) the error checking and correcting circuit is configured to sequentially perform a plurality of extreme value search operations on the error value sets to identify a target extreme value from all error values in the error value sets, and set a second error threshold for a next iterative operation according to the target extreme value;
- step (5) the error checking and correcting circuit is configured to sequentially perform a plurality of bit-flipping operations respectively on the plurality of data bit value sets according to a first error threshold for a current iterative operation and the error value sets so as to update the plurality of data bit value sets as updated data bit value sets, wherein if the current iterative operation is a first iterative operation, the first error threshold for the current iterative operation is a predetermined error threshold, wherein if the current iterative operation is not the first iterative operation, the first error threshold for the current iterative operation is an error threshold identified in a previous iterative operation, wherein in response to completing a first bit-flipping operation, a step (6) is performed simultaneously, wherein the error checking and correcting circuit is configured to perform an error function calculation on a second data bit value set to obtain a second error value set corresponding to the second data bit value set, an extreme value search operation of a first data bit value set, and the first bit-flipping operation on the first error value set simultaneously to shortened the decoding operation on the plurality of data bit value sets stored in the non-transitory rewritable non-volatile memory;

step (6) the error checking and correcting circuit is configured to sequentially perform a plurality of syndrome calculation operations respectively on the updated data bit value sets by using the parity check sub-matrices, so as to obtain an updated plurality of temporary syndromes respectively corresponding to the updated data bit value sets, wherein in response to obtaining all the plurality of temporary syndromes respectively corresponding to the updated data bit value sets, the error checking and correcting circuit is configured to complete the current iterative operation and perform the step (2), wherein each of said iterative operations comprises the steps (2) to (6), wherein the updated data bit value sets, the corresponding plurality of temporary syndromes and the first error threshold obtained from the current iterative operation are used in the next iterative operation, wherein in the operation of the step (2), the error checking and correcting circuit is configured to sequentially perform an XOR calculation on the plurality of temporary syndromes to obtain a final syndrome, wherein if a plurality of values of the final syndrome are all zero, the error checking and correcting circuit is configured to determine the codeword as correct, wherein if the values of the final syndrome are not all zero, the error checking and correcting circuit is configured to determine the codeword as incorrect.

10. The storage controller as recited in claim 9, wherein in the step (5), step (5-1) the error checking and correcting circuit is configured to select a target data bit value set not yet selected according to a sequence of the plurality of data bit value sets, and identify a target error value set corresponding to the target data bit value set in the error value sets;

step (5-2) the error checking and correcting circuit is configured to determine whether one or more target error values less than or equal to the first error threshold exist in a plurality of error values of the target error value set according to the first error threshold;

step (5-3) if said one or more target error values less than or equal to the first error threshold exist, the error checking and correcting circuit is configured to flip one or more target data bit values corresponding to said one or more target error values in the target data bit value set according to said one or more target error values, so as to complete the bit-flipping operation corresponding to the target data bit value set; and step (5-4) if the plurality of data bit value sets include the data bit value set not yet selected for the bit-flipping operation, the error checking and correcting circuit is configured to perform the step (5-1), wherein if the plurality of data bit value sets do not include the data bit value set not yet selected for the bit-flipping operation, the error checking and correcting circuit is configured to determine the bit-flipping operations of all the plurality of data bit value sets as completed.

11. The storage controller as recited in claim 9, wherein in the operation of sequentially performing the extreme value search operations on the error value sets to identify the target extreme value from all the error values in the error value sets in the step (4), step (4-1) the error checking and correcting circuit is configured to select a target error value set not yet selected according to a sequence of the error value sets, perform the extreme value search operation on the target error value set to identify a minimum value among a plurality of error values in the target error value set, and use the minimum value as a local target error value corresponding to the target error value set;

step (4-2) if a global target error value already exists, the error checking and correcting circuit is configured to use a smaller one of the local target error value and the global target error value as a new global target error value, wherein if the global target error value does not exist, the local target error value is used as the new global target error value; and step (4-3) if the error value sets include an error value set not yet selected for the extreme value search operation, the error checking and correcting circuit is configured to perform the step (4-1), wherein if the error value sets do not include any error value set not yet selected for the extreme value search operation, the extreme value search operations corresponding to all the error value sets are determined as completed, and the latest global target error value is identified as the target extreme value.

12. The storage controller as recited in claim 11, wherein in the operation of setting the second error threshold for the next iterative operation according to the target extreme value in the step (4), if an absolute difference between the target extreme value and zero is not less than a predetermined offset value, the error checking and correcting circuit is configured to set a sum obtained from the target extreme value plus a predetermined acceleration value as the second error threshold for the next iterative operation; and if the absolute difference between the target extreme value and zero is less than a predetermined offset value, the error checking and correcting circuit is configured to directly set the target extreme value as the second error threshold for the next iterative operation.

13. The storage controller as recited in claim 9, wherein in the operation of the step (5), step (5-1) the error checking and correcting circuit is configured to select a target data bit value set not yet selected according to a sequence of the plurality of data bit value sets, and identify a target error value set corresponding to the target data bit value set in the error value sets;

step (5-2) the error checking and correcting circuit is configured to determine whether one or more target error values greater than or equal to the first error threshold exist in a plurality of error values of the target error value set according to the first error threshold;

step (5-3) if said one or more target error values greater than or equal to the first error threshold exist, the error checking and correcting circuit is configured to flip one or more target data bit values corresponding to said one or more target error values in the target data bit value set according to said one or more target error values, so as to complete the bit-flipping operation corresponding to the target data bit value set; and step (5-4) if the plurality of data bit value sets include the data bit value set not yet selected for the bit-flipping operation, the error checking and correcting circuit is configured to perform the step (5-1), wherein if the plurality of data bit value sets do not include the data bit value set not yet selected for the bit-flipping operation, the error checking and correcting circuit is configured to determine the bit-flipping operations of all the plurality of data bit value sets as completed.

14. The storage controller as recited in claim 9, wherein in the operation of sequentially performing the extreme value search operations on the error value sets to identify the target extreme value from all the error values in the error value sets in the step (4), step (4-1) the error checking and correcting circuit is configured to select a target error value set not yet selected according to a sequence of the error value sets, perform the extreme value search operation on the target error value set to identify a maximum value among a plurality of error values in the target error value set, and use the maximum value as a local target error value corresponding to the target error value set;

step (4-2) if a global target error value already exists, the error checking and correcting circuit is configured to use a greater one of the local target error value and the global target error value as a new global target error value, wherein if the global target error value does not exist, the local target error value is used as the new global target error value; and step (4-3) if the error value sets include an error value set not yet selected for the extreme value search operation, the error checking and correcting circuit is configured to perform the step (4-1), wherein if the error value sets do not include any error value set not yet selected for the extreme value search operation, the error checking and correcting circuit is configured to determine the extreme value search operations corresponding to all the error value sets as completed, and identify the latest global target error value as the target extreme value.

15. The storage controller as recited in claim 14, wherein in the operation of setting the second error threshold for the next iterative operation according to the target extreme value in the step (4), if an absolute difference between the target extreme value and zero is not less than a predetermined offset value, the error checking and correcting circuit is configured to set a difference obtained from the target extreme value minus a predetermined acceleration value as the second error threshold for the next iterative operation; and if the absolute difference between the target extreme value and zero is less than a predetermined offset value, the error checking and correcting circuit is configured to directly set the target extreme value as the second error threshold for the next iterative operation.

16. The storage controller as recited in claim 9, wherein in the operation of the step (3), step (3-1) the error checking and correcting circuit is configured to select a target data bit value set not yet selected in the plurality of data bit value sets according to a sequence of the plurality of data bit value sets, and identify a plurality of target data bit values of the target data bit value sets;

step (3-2) the error checking and correcting circuit is configured to perform the error function calculation corresponding to the target data bit value set according to the final syndrome obtained from the plurality of temporary syndromes and a predetermined error value calculation formula, so as to calculate a plurality of error values respectively corresponding to the target data bit values, and use the error values respectively corresponding to the target data bit values as an error value set corresponding to the target data bit value set; and step (3-3) if the plurality of data bit value sets include the data bit value set not yet selected for the error function calculation, the error checking and correcting circuit is configured to perform the step (3-1), wherein if the plurality of data bit value sets do not include the data bit value set not yet selected for the error function calculation, the error checking and correcting circuit is configured to determine the plurality of error function calculations corresponding to all the plurality of data bit value sets as completed.

\* \* \* \* \*